US011460960B2

(12) United States Patent
Kim et al.

(10) Patent No.: US 11,460,960 B2
(45) Date of Patent: Oct. 4, 2022

(54) DISPLAY DEVICE

(71) Applicant: LG Display Co., Ltd., Seoul (KR)

(72) Inventors: Chi-Wan Kim, Paju-si (KR); Tae-Heon Kim, Paju-si (KR); Sung-Eui Shin, Paju-si (KR); Yong-Woo Lee, Paju-si (KR); Kyung-Yeol Ryu, Paju-si (KR); Yu-Seon Kho, Paju-si (KR); Yong-Gyoon Jang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 119 days.

(21) Appl. No.: 16/710,201

(22) Filed: Dec. 11, 2019

(65) Prior Publication Data

US 2020/0209997 A1 Jul. 2, 2020

(30) Foreign Application Priority Data

Dec. 27, 2018 (KR) .......................... 10-2018-0170856

(51) Int. Cl.
| | |
|---|---|
| *G06F 3/045* | (2006.01) |
| *G06F 3/044* | (2006.01) |
| *H01L 41/08* | (2006.01) |
| *G06F 3/041* | (2006.01) |
| *H01L 41/187* | (2006.01) |
| *H01L 41/113* | (2006.01) |
| *H01L 41/18* | (2006.01) |

(52) U.S. Cl.
CPC .......... *G06F 3/044* (2013.01); *G06F 3/0414* (2013.01); *H01L 41/0815* (2013.01); *H01L 41/1132* (2013.01); *H01L 41/183* (2013.01); *H01L 41/187* (2013.01); *G06F 2203/04105* (2013.01)

(58) Field of Classification Search
CPC ............... G06F 3/044; G06F 3/0414; G06F 2203/04105; H01L 41/0815; H01L 41/187; H01L 41/1132; H01L 41/183
See application file for complete search history.

(56) References Cited

U.S. PATENT DOCUMENTS

| | | | |
|---|---|---|---|
| 2017/0228072 A1 | 8/2017 | Amin et al. | |
| 2019/0094968 A1* | 3/2019 | Wen ...................... | G06F 3/0445 |
| 2019/0377452 A1* | 12/2019 | Routley ................ | G06F 3/0416 |

FOREIGN PATENT DOCUMENTS

| | | |
|---|---|---|
| KR | 10-2010-0092292 A | 8/2010 |
| KR | 10-2017-0070173 A | 6/2017 |
| KR | 10-2018-0000187 A | 1/2018 |

OTHER PUBLICATIONS

Song et al., "Flexible Piezoelectric Energy Harvesting", Ceramist. 2012,15(2), pp. 35-44, Published online Apr. 30, 2012.
Lee et al., "High-performance piezoelectric nanogenerators based on chemically-reinforced composites", Energy & Environmental Science, Jun. 2018, vol. 11, No. 6, pp. 1425-1430.
Sohn et al., "Pizeoelectric Vibration Energy Harvesting", Jan. 2016, Korean Society for Noise and Vibration Engineering(KSNVE), Journal of KSNVE, vol. 26, No. 1, 2016.1, pp. 4-11.

\* cited by examiner

*Primary Examiner* — Adam R. Giesy
(74) *Attorney, Agent, or Firm* — Morgan, Lewis & Bockius LLP

(57) ABSTRACT

A display device includes a touch panel; a display panel under the touch panel and displaying an image; a piezoelectric element under the touch panel and including an upper electrode, a lower electrode and a piezoelectric layer; and a rectifying circuit connected to the piezoelectric element.

17 Claims, 7 Drawing Sheets

DISPLAY DEVICE

This application claims priority from and the benefit of Korean Patent Application No. 10-2018-0170856 filed on Dec. 27, 2018, which is hereby incorporated herein by reference in its entirety for all purposes as if fully set forth herein.

BACKGROUND

Technical Field

The present disclosure relates to a display device, and more particularly, to a display device having a piezoelectric element.

Discussion of the Related Art

An electroluminescent display device may be a flat panel display device. An electroluminescent display device has a wide viewing angle as compared with a liquid crystal display device because it is self-luminous, thin, light weight, and low in power consumption because a backlight unit is not necessary. In addition, an electroluminescent display device is driven by low voltages of direct current (DC) and has a fast response time. An electroluminescent display device is also resistant to external impacts and may be used in a wide range of temperatures because its components are solids. An electroluminescent display device may also be manufactured at low cost.

An electroluminescent display device has been applied to various devices. Especially, the electroluminescent display device has been widely applied to portable devices such as smartphones, multimedia devices or table PCs. By the way, since these portable devices are supplied with power sources through a battery, there is a limitation in supplying the power sources.

SUMMARY

Accordingly, embodiments of the present disclosure are directed to a display device that substantially obviates one or more of the problems due to limitations and disadvantages of the related art.

An aspect of the present disclosure is to provide a display device that is capable of improving the power efficiency.

Additional features and aspects will be set forth in the description which follows, and in part will be apparent from the description, or may be learned by practice of the inventive concepts provided herein. Other features and aspects of the inventive concepts may be realized and attained by the structure particularly pointed out in the written description, or derivable therefrom, and claims hereof as well as the appended drawings.

To achieve these and other aspects of the inventive concepts, as embodied and broadly described herein, a display device comprises a touch panel; a display panel under the touch panel and displaying an image; a piezoelectric element under the touch panel and including an upper electrode, a lower electrode and a piezoelectric layer; and a rectifying circuit connected to the piezoelectric element.

It is to be understood that both the foregoing general description and the following detailed description are exemplary and explanatory, and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles of the present disclosure. In the drawings.

DETAILED DESCRIPTION

Reference will now be made in detail to example embodiments of the disclosure, which are illustrated in the accompanying drawings.

First Embodiment

Figure 1:
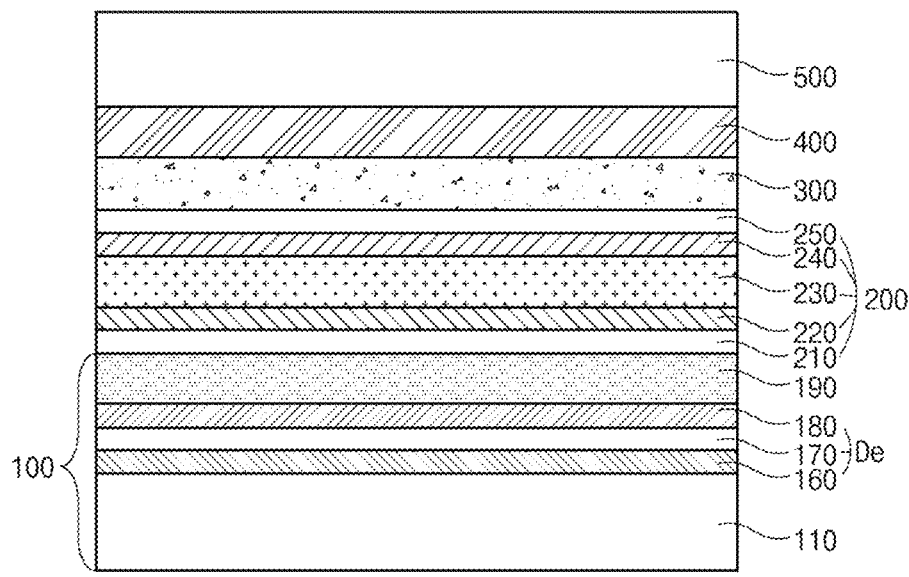
FIG. 1 is a cross-sectional view schematically illustrating a display device according to a first embodiment of the present disclosure.

FIG. 1 is a cross-sectional view schematically illustrating a display device according to a first embodiment of the present disclosure.

In FIG. 1, the display device according to the first embodiment of the present disclosure includes a display panel 100, a piezoelectric element 200, a touch panel 300, a polarizing plate 400 and a cover window 500.

Here, the display panel 100 may be an electroluminescent display panel. More particularly, the display panel 100 may include a light-emitting diode De on a substrate 110 and an encapsulation layer 190 on the light-emitting diode De. The light-emitting diode De includes a first electrode 160, a second electrode 180, and a light-emitting layer 180 between the first and second electrodes 160 and 180.

However, the present disclosure is not limited thereto, and the display panel 100 may be a liquid crystal display panel including a liquid crystal capacitor.

The piezoelectric element 200 is disposed on the display panel 100. The piezoelectric element 200 includes a first buffer layer 210, a lower electrode 220, a piezoelectric layer 230, an upper electrode 240, and a second buffer layer 250.

The first and second buffer layers 210 and 250 may be formed of a transparent insulating material. For example, the first and second buffer layers 210 and 250 may be formed of an inorganic insulating material such as silicon oxide ($SiO_2$) or silicon nitride (SiNx). Alternatively, the first and second buffer layers 210 and 250 may be formed of an organic insulating material such as photo acryl, but is not limited thereto.

The lower electrode 220 and the upper electrode 240 may be formed of a transparent conductive material. For example, the lower electrode 220 and the upper electrode 240 may be formed of indium tin oxide (ITO) or indium zinc oxide (IZO), but is not limited thereto.

The piezoelectric layer 230 may be formed of a piezoelectric material that generates electrical energy by causing deformation of the material due to external mechanical energy. The piezoelectric material may be a transparent piezoelectric polymer.

For example, the piezoelectric polymer may be PVDF (polyvinylidene fluoride), P(VDF-TrFE) (polyvinylidene fluoride-co-trifluoroethylene), P(VDF-TrFE-CFE) (poly(vinylidene fluoride-co-triluoroethylene-chlorofluoroethylene), P(VDF-TrFE-CTFE) (poly(vinylidene fluoride-co-triluoroethylene-chlorotrifluoroethylene), PVDF doped with carbon nanotubes, or a phosphazene-based polymer, but is not limited thereto. Here, poly bis(trifluoroethoxy) phosphazene may be used as the phosphazene-based polymer.

Next, the touch panel 300 is disposed on the piezoelectric element 200. The touch panel 300 may be a mutual capacitance type in which a transmitting line and a receiving line are independently formed and a change in capacitance between the transmitting line and the receiving line is detected according to a touch. However, the present disclosure is not limited thereto.

The polarizing plate 400 may be disposed on the touch panel 300. The touch panel 300 may be a circular polarizing plate which includes a linear polarizer and a quarter wave plate and changes linearly polarized light into circularly polarized light and circularly polarized light into linearly polarized light. The polarizing plate 400 may improve the contrast ratio by blocking external light from being outputted after being reflected at the display panel 100.

The cover window 500 is disposed on the polarizing plate 400. The cover window 500 protects the display panel 100 from the external impacts. The cover window 500 may be attached to an upper portion of the display panel 100, more particularly, to the polarizing plate 400 through an adhesive layer (not shown). The cover window 500 may be formed of glass or plastic, but is not limited thereto.

As described above, in the display device according to the first embodiment of the present disclosure, an energy harvesting element for reproducing energy can be implemented by providing the piezoelectric element 200 between the display panel 100 and the touch panel 300, generating electrical energy from an external force by a touch, and charging a battery with the generated electrical energy.

It is preferable that the piezoelectric element 200 is disposed close to the cover window 500 in order to improve the energy harvesting efficiency.

At this time, in the piezoelectric element 200, a rectifying circuit is needed to store the generated electrical energy into the battery. The rectifying circuit is illustrated in FIG. 2 and FIG. 3.

Figure 2:
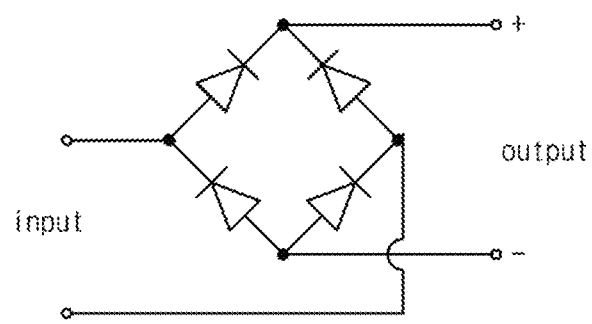
FIG. 2 is a circuit diagram of a rectifying circuit according to an embodiment of the present disclosure.
Figure 3:
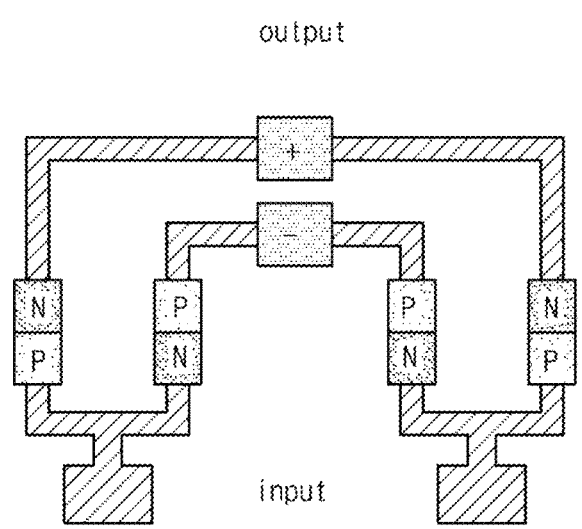
FIG. 3 is a schematic plan view of a rectifying circuit according to the embodiment of the present disclosure.

FIG. 2 is a circuit diagram of a rectifying circuit according to an embodiment of the present disclosure, and FIG. 3 is a schematic plan view of a rectifying circuit according to the embodiment of the present disclosure.

In FIG. 2 and FIG. 3, the rectifying circuit according to the embodiment of the present disclosure may be a bridge circuit connecting four diodes. Here, input terminals are connected to the piezoelectric element 200, and output terminals are connected to the battery, thereby changing alternating current input of the piezoelectric element 200 into direct current output.

In the rectifying circuit, P-type semiconductor and/or N-type semiconductor of the diode may be formed through the same process as a semiconductor layer of the display panel 100, and an anode and a cathode of the diode may be formed through the same process as a gate line or a data line of the display panel 100.

Figure 4:
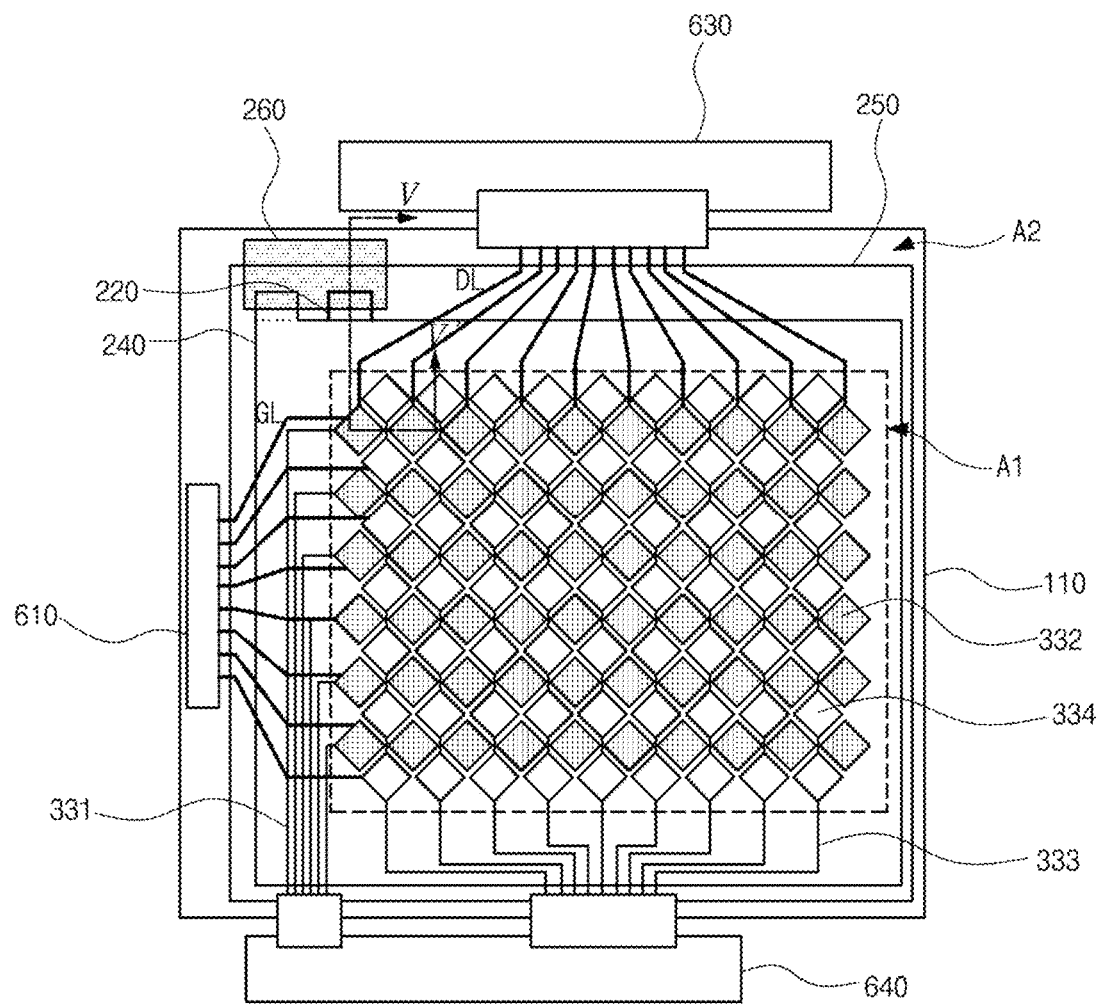
FIG. 4 is a plan view schematically illustrating a display device according to the first embodiment of the present disclosure.

FIG. 4 is a plan view schematically illustrating a display device according to the first embodiment of the present disclosure. Description will be made with reference to FIG. 1 and FIG. 4.

In FIG. 1 and FIG. 4, a display area A1 displaying an image and a non-display area A2 surrounding the display area A1 are defined on a substrate 110 of the display panel 100.

In the display area A1 on the substrate 110, gate lines GL are formed along a first direction, and data lines DL are formed along a second direction crossing the first direction. In addition, although not shown in the figures, one or more thin film transistors, one or more capacitors and a light-emitting diode De are formed in each pixel region of the display area A1 on the substrate 110, and the encapsulation layer 190 is formed to cover them.

Meanwhile, a gate driver 610 is provided in a first section of the non-display area A2 on the substrate 110. The gate lines GL are connected to the gate driver 610 and receive scan signals. The gate driver 610 may be configured as a gate-in-panel (GIP) type in which its components are formed through the same processes as the elements of the display area A1.

Further, a data driver 630 is attached to a second section of the non-display area A2 on the substrate 110. The data lines DL are connected to the data driver 630 and receive data signals.

Then, the piezoelectric element 200 is disposed on the display panel 100. The piezoelectric element 200 includes the lower electrode 220, the upper electrode 240, and the piezoelectric layer 230 between the lower electrode 220 and the upper electrode 240.

Here, the piezoelectric layer 230 may have an area corresponding to the lower electrode 220 or the upper electrode 240.

The lower electrode 220 and the upper electrode 240 have substantially the same area, and the area of each of the lower electrode 220 and the upper electrode 240 is larger than the display area A1. Therefore, the lower electrode 220 and the upper electrode 240 are disposed not only in the display area A1 but also partially in the non-display area A2. Each of the lower electrode 220 and the upper electrode 240 may have a protrusion in the non-display area A2. The protrusion of the lower electrode 220 and the protrusion of the upper electrode 240 are spaced apart from each other and are connected to the rectifying circuit 260 formed in the non-display area A2. The rectifying circuit 260 has the configuration of FIG. 2 and FIG. 3.

Here, although the rectifying circuit 260 is illustrated as being formed in the non-display area A2 corresponding to an upper left corner of the substrate 110, but the position of the rectifying circuit 260 is not limited thereto. The rectifying circuit 260 may be formed in any position of the non-display area A2. For example, the rectifying circuit 260 may be formed in an upper right corner, a lower right corner or a lower left corner of the substrate 110 corresponding to the non-display area A2.

The first buffer layer 210 is formed under the lower electrode 220, and the second buffer layer 250 is formed on the upper electrode 240. The second buffer layer 250 may have a larger area than each of the lower and upper electrodes 220 and 240. In addition, the first buffer layer 210 may have the same area as the second buffer layer 250.

Next, the touch panel 300 is disposed on the piezoelectric element 200. The touch panel 300 includes transmitting lines and receiving lines formed in the display area A1. Here, the transmitting lines and the receiving lines cross each other to form mutual capacitors. Each transmitting line includes a plurality of transmitting electrodes 332 connected to each other in the first direction, and each receiving line includes a plurality of receiving electrodes 334 connected to each other in the second direction. Each transmitting electrode 332 and each receiving electrode may have a rhombus shape, but is not limited thereto.

In addition, the touch panel 300 includes first routing lines 331 and second routing lines 333 formed in the non-display area A2. The first routing lines 331 are connected to the transmitting lines, and the second routing lines 333 are connected to the receiving lines.

The first and second routing lines 331 and 333 are connected to a touch driver 640, which is attached to a third section of the non-display area A2 on the substrate 110. Therefore, the first routing line 331 transfers a touch driving voltage from the touch driver 640 to the transmitting line, and the second routing line 333 transfers a touch sensing voltage from the receiving line to the touch driver 640.

Meanwhile, the polarizing plate 400 and the cover window 500 may be disposed on the touch panel 300.

In the display device according to the first embodiment of the present disclosure, when a touch of a user is performed, the capacitance of the mutual capacitor is varied, and the touch sensing voltage is changed. The touch driver 640 analyzes the touch sensing voltage and detects a touch point.

Moreover, a force is applied to the piezoelectric element 200 by the touch of the user. Thus, a change in polarization occurs due to the mechanical fluctuation of the piezoelectric material, and this causes a potential difference to generate the electrical energy. The electrical energy is stored in a battery (not shown) through the rectifying circuit 260. Accordingly, by changing the mechanical energy by the touch into the electrical energy and using it, the power efficiency of the display device may be improved.

The configuration of a display device according to the first embodiment of the present disclosure including a piezoelectric element will be described in more detail with reference to FIG. 5.

Figure 5:
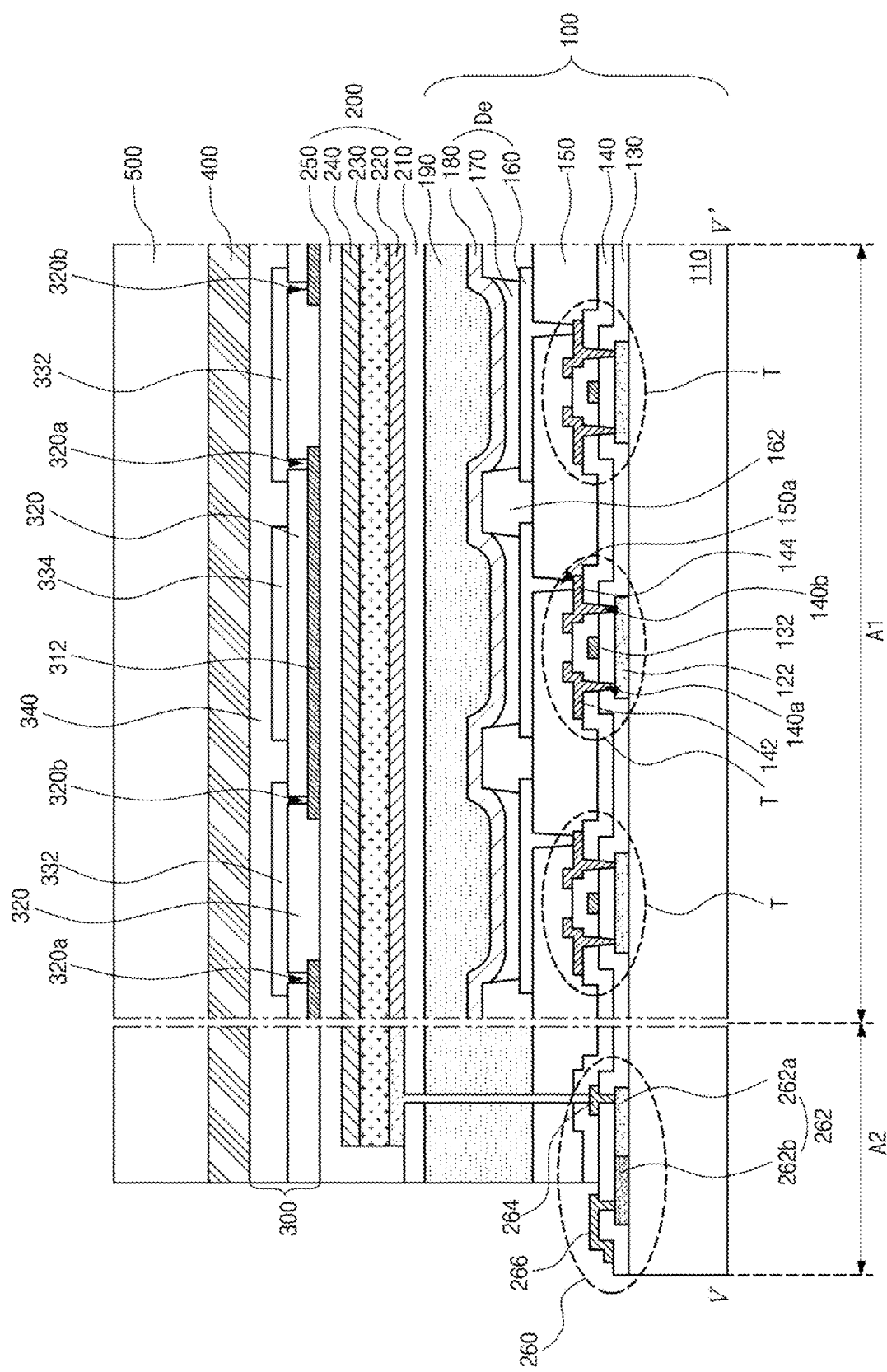
FIG. 5 is a schematic cross-sectional view of a display device including a piezoelectric element according to the first embodiment of the present disclosure and corresponds to the line V-V' of FIG. 4.

FIG. 5 is a schematic cross-sectional view of a display device including a piezoelectric element according to the first embodiment of the present disclosure and corresponds to the line V-V' of FIG. 4. Here, an electroluminescent display panel is used as an example of the display panel, but the present disclosure is not limited thereto.

In FIG. 5, the display device according to the first embodiment of the present disclosure includes a display panel 100, a piezoelectric element 200, a touch panel 300, a polarizing plate 400, and a cover window 500.

More particularly, a display area A1, which includes a plurality of pixel regions and displays an image, and a non-display area A2, which surrounds the display area A1, are defined on a substrate 110 of the display panel 100.

A semiconductor layer 122 is formed in the display area A1 on the substrate 110 and is patterned to correspond to each pixel region. The substrate 110 may be a glass substrate or a plastic substrate. For example, polyimide may be used for the plastic substrate, but is not limited thereto.

The semiconductor layer 122 may be formed of polycrystalline silicon, and in this case, both ends of the semiconductor layer 122 may be doped with impurities.

Meanwhile, a buffer layer (not shown) may be further formed between the substrate 110 and the semiconductor layer 122. The buffer layer may be formed of an inorganic insulating material such as silicon oxide ($SiO_2$) or silicon nitride (SiNx) and may be a single layer or a multiple layer.

A gate insulating layer 130 of an insulating material is formed on the semiconductor layer 122 substantially all over the substrate 110. The gate insulating layer 130 may be formed of an inorganic insulating material such as silicon oxide ($SiO_2$) or silicon nitride (SiNx).

A gate electrode 132 of a conductive material such as metal is formed on the gate insulating layer 130 corresponding to a center of the semiconductor layer 122. In addition, a gate line (not shown) and a first capacitor electrode (not shown) may be formed on the gate insulating layer 130. The gate line extends in a first direction, and the first capacitor electrode is connected to the gate electrode 132.

Meanwhile, in the first embodiment of the present disclosure, although the gate insulating layer 130 is formed substantially all over the substrate 110, the gate insulating layer 130 may be patterned to have the same shape as the gate electrode 132.

An interlayer insulating layer 140 of an insulating material is formed on the gate electrode 132 substantially all over the substrate 110. The interlayer insulating layer 140 may be formed of an inorganic insulating material such as silicon oxide ($SiO_2$) or silicon nitride (SiNx) or an organic insulating material such as photo acryl or benzocyclobutene.

The interlayer insulating layer 140 has first and second contact holes 140a and 140b exposing top surfaces of the both ends of the semiconductor layer 122. The first and second contact holes 140a and 140b are disposed at both sides of the gate electrode 132 and are spaced apart from the gate electrode 132. Here, the first and second contact holes 140a and 140b are formed in the gate insulating layer 130. Alternatively, when the gate insulating layer 130 is patterned to have the same shape as the gate electrode 132, the first and second contact holes 140a and 140b are formed only in the interlayer insulating layer 140.

Source and drain electrodes 142 and 144 of a conductive material such as metal are formed on the interlayer insulating layer 140. In addition, a data line (not shown), a power line (not shown) and a second capacitor electrode (not shown) may be formed on the interlayer insulating layer 140.

The source and drain electrodes 142 and 144 are spaced apart from each other with the gate electrode 132 disposed therebetween. The source and drain electrodes 142 and 144 contact the both ends of the semiconductor layer 122 through the first and second contact holes 140a and 140b, respectively. Although not shown in the figure, the data line extends in a second direction and crosses the gate line to define each pixel region. The power line for supplying high potential voltage is spaced apart from the data line. The second capacitor electrode is connected the drain electrode 144 and overlaps the first capacitor to form a storage capacitor with the interlayer insulating layer 140 therebetween as a dielectric. Alternatively, the first capacitor electrode may be connected to the drain electrode 144, and the second capacitor electrode may be connected to the gate electrode 132.

In the meantime, the semiconductor layer 122, the gate electrode 132, and the source and drain electrodes 142 and 144 constitute a thin film transistor T. Here, the thin film transistor T may have a coplanar structure in which the gate electrode 132 and the source and drain electrodes 142 and 144 are disposed at one side of the semiconductor layer 122, that is, over the semiconductor layer 122, but is not limited thereto.

The thin film transistor T corresponds to a driving thin film transistor. A switching thin film transistor (not shown) having the same structure as the driving thin film transistor T may be further formed in each pixel region on the substrate 110. At this time, the gate electrode 132 of the driving thin film transistor T may be connected to a drain electrode (not shown) of the switching thin film transistor, and the source electrode 142 of the driving thin film transistor T may be connected to the power line (not shown). In addition, a gate electrode (not shown) and a source electrode (not shown) of the switching thin film transistor may be connected to the gate line and the data line, respectively.

Meanwhile, one or more sensing thin film transistors having the same structure as the driving thin film transistor T may be further formed in each pixel region on the substrate 110, but is not limited thereto.

An overcoat layer 150 of an insulating material is formed on the source and drain electrodes 142 and 144 substantially all over the substrate 110. The overcoat layer 150 may be formed of an organic insulating material such as photo acryl or benzocyclobutene. The overcoat layer 150 may have a flat top surface.

In the meantime, an insulating layer may be further formed under the overcoat layer 150. The insulating layer may be formed of an inorganic insulating material such as silicon oxide ($SiO_2$) or silicon nitride (SiNx).

The overcoat layer 150 has a drain contact hole 150a exposing the drain electrode 144. Here, the drain contact hole 150a may be spaced apart from the second contact hole 140b. Alternatively, the drain contact hole 150a may be formed directly over the second contact hole 140b.

A first electrode 160 of a conductive material having a relatively high work function is formed on the overcoat layer 150. The first electrode 160 is formed in each pixel region and contacts the drain electrode 144 through the drain contact hole 150a. For example, the first electrode 160 may be formed of a transparent conductive material such as indium tin oxide (ITO) or indium zinc oxide (IZO), but is not limited thereto.

Meanwhile, the electroluminescent display device 100 of the display device according to the first embodiment of the present disclosure may be a top emission type in which light of a light-emitting diode is output toward a direction opposite the substrate 110. Accordingly, the first electrode 160 may further include a reflective electrode or a reflective layer, which is formed of a metal material having relatively high reflectance, under the transparent conductive material layer. For example, the reflective electrode or the reflective layer may be formed of aluminum-palladium-copper (APC) alloy or silver (Ag). At this time, the first electrode 160 may have a triple-layered structure of ITO/APC/ITO or ITO/Ag/ITO, but is not limited thereto.

A bank 162 of an insulating material is formed on the first electrode 160. The bank 162 overlaps edges of the first electrode 160, covers the edges of the first electrode 160, and exposes a central portion of the first electrode 160. The bank 162 may be formed of an organic insulating material having a hydrophobic property. Alternatively, the bank 162 may be formed of an organic insulating material having a hydrophilic property and may be treated to have a hydrophobic property. However, the present disclosure is not limited thereto. Meanwhile, a bank having a hydrophilic property may be further formed under the bank 162.

Next, a light-emitting layer 170 is formed on the first electrode 160 exposed by the bank 162.

Although not shown in the figure, the light-emitting layer 170 may include a first charge auxiliary layer, a light-emitting material layer and a second charge auxiliary layer sequentially disposed on the first electrode 160. The light-emitting material layer may be formed of any one of red, green and blue luminescent materials, but is not limited thereto. The luminescent material may be an organic luminescent material such as a phosphorescent compound or a fluorescent compound or may be an inorganic luminescent material such as a quantum dot.

The first charge auxiliary layer may be a hole auxiliary layer, and the hole auxiliary layer may include at least one of a hole injecting layer (HIL) and a hole transporting layer (HTL). In addition, the second charge auxiliary layer may be an electron auxiliary layer, and the electron auxiliary layer may include at least one of an electron injecting layer (EIL) and an electron transporting layer (ETL). However, the present disclosure is not limited thereto, and other variations are possible.

Here, the light-emitting layer 170 may be formed through a solution process. Thus, the process may be simplified and a display device with a large size and high resolution may be provided. A spin coating method, an ink jet printing method, or a screen printing method may be used as the solution process, but the present disclosure is not limited thereto and other variations are possible. When the solution is dried, a drying speed of a solvent in a region adjacent to the bank 162 is different from that in other regions. Therefore, a height of the light-emitting layer 170 in the region adjacent to the bank 162 may rise as it gets closer to the bank 162.

Alternatively, the light-emitting layer 170 may be formed through a vacuum evaporation process, but is not limited thereto.

A second electrode 180 of a conductive material having a relatively low work function is formed on the light-emitting layer 170 substantially all over the display area A1. The second electrode 180 may be formed of aluminum (Al), magnesium (Mg), silver (Ag), or an alloy thereof. The second electrode 180 may have a relatively thin thickness such that light from the light-emitting layer 170 may be transmitted therethrough. Alternatively, the second electrode 180 may be formed of a transparent conductive material such as indium-gallium-oxide (IGO), but is not limited thereto.

The first electrode 160, the light-emitting layer 170 and the second electrode 180 constitute a light-emitting diode De. The first electrode 160 may serve as an anode, and the second electrode 180 may serve as a cathode, but is not limited thereto.

As described above, the electroluminescent display device 100 according to the first embodiment of the present disclosure may be a top emission type in which light from the light-emitting layer 170 of the light-emitting diode De is output toward a direction opposite the substrate 110, that is, output to the outside through the second electrode 180. The top emission type display device may have a wider emission area than a bottom emission type display device of the same size, to thereby improve luminance and reduce power consumption.

At this time, the light-emitting diode De of each pixel region may have an element thickness for a micro-cavity effect corresponding to a wavelength of the emitted light, thereby increasing the light efficiency.

Next, an encapsulation layer 190 may be formed on the second electrode 180 substantially all over the substrate 110 to block moisture or oxygen introduced from the outside, thereby protecting the light-emitting diode De. The encapsulation layer 190 may be formed of UV sealant or frit sealant. Alternatively, the encapsulation layer 190 may include inorganic layers and organic layers alternately stacked.

Meanwhile, a rectifying circuit 260 is formed in the non-display area A2 on the substrate 110. The rectifying circuit 260 includes a semiconductor pattern 262, an anode 264 and a cathode 266. Here, the cathode 266 may be exposed to the outside and connected to a battery (not shown). Alternatively, the anode 264 may be exposed to the outside and connected to the battery.

The semiconductor pattern 262 includes a P-type semiconductor region 262a and an N-type semiconductor region 262b, and one of the P-type semiconductor region 262a and the N-type semiconductor region 262b may be formed of the same material through the same process as the semiconductor layer 122 of the display area A1. For example, the P-type semiconductor region 262a may be formed of the same material through the same process as the semiconductor layer 122, but is not limited thereto.

In addition, the anode 264 and the cathode 266 may be formed of the same material through the same process as the gate electrode 132 of the display area A1. In this case, the gate insulating layer 130 may have contact holes exposing the P-type semiconductor region 262a and the N-type semiconductor region 262b, and the anode 264 and the cathode 266 may contact the P-type semiconductor region 262a and the N-type semiconductor region 262b through the contact holes, respectively.

Alternatively, the anode 264 and the cathode 266 may be formed of the same material through the same process as the source and drain electrodes 142 and 144 of the display area A1. In this case, the interlayer insulating layer 140 may have contact holes exposing the P-type semiconductor region 262a and the N-type semiconductor region 262b, and the anode 264 and the cathode 266 may contact the P-type semiconductor region 262a and the N-type semiconductor region 262b through the contact holes, respectively.

However, the present disclosure is not limited thereto. For example, the anode 264 and the cathode 266 may be formed in a layer different from the gate electrode 122 or the source and drain electrodes 142 and 144 and may be formed in different layers from each other.

In addition, the P-type semiconductor region 262a and the N-type semiconductor region 262b may be formed of the same material through the same process as an element of the gate driver 610 of FIG. 4 and may be formed through an additional process.

Next, a piezoelectric element 200 is formed on the encapsulation layer 190. The piezoelectric element 200 includes first and second buffer layers 210 and 250, a lower electrode 220, an upper electrode 240, and a piezoelectric layer 230.

More particularly, the first buffer layer 210 is formed on the encapsulation layer 190 substantially all over the substrate 110. The first buffer layer 210 may be formed of a transparent insulating material. For example, the first buffer layer 210 may be formed of an inorganic insulating material such as silicon oxide ($SiO_2$) or silicon nitride (SiNx). Alternatively, the first buffer layer 210 may be formed of an organic insulating material such as photo acryl, but is not limited thereto.

The first buffer layer 210 has a contact hole exposing the anode 264 in the non-display area A2. At this time, the contact hole is also formed in the encapsulation layer 190, the overcoat layer 150 and the interlayer insulating layer 140. In addition, although not shown in the figure, the first buffer layer 210 may have a contact hole exposing another cathode or another anode.

The lower electrode 220 is formed on the first buffer layer 210 substantially all over the substrate 110. The lower electrode 220 contacts the anode 264 through the contact hole of the first buffer layer 210 in the non-display area A2. The lower electrode 220 may be formed of a transparent conductive material. For example, the lower electrode 220 may be formed of indium tin oxide (ITO) or indium zinc oxide (IZO), but is not limited thereto.

The piezoelectric layer 230 is formed on the lower electrode 220 substantially all over the substrate 110. It is preferable that the piezoelectric layer 230 is formed of a transparent piezoelectric polymer.

The upper electrode 240 is formed on the piezoelectric layer 230 substantially all over the substrate 110. The upper electrode 240 may be formed of a transparent conductive material. For example, the upper electrode 240 may be formed of indium tin oxide (ITO) or indium zinc oxide (IZO), but is not limited thereto.

Although not shown in the figure, the upper electrode 240 may contact another cathode or another anode through the contact hole of the first buffer layer 210 exposing another cathode or another anode in the non-display area A2.

Next, the second buffer layer 250 is formed on the upper electrode 240 substantially all over the substrate 110. The second buffer layer 250 may be formed of a transparent insulating material. For example, the second buffer layer 250 may be formed of an inorganic insulating material such as silicon oxide ($SiO_2$) or silicon nitride (SiNx). Alternatively, the second buffer layer 250 may be formed of an organic insulating material such as photo acryl, but is not limited thereto.

The second buffer layer 250 may cover side surfaces of the lower electrode 220, the piezoelectric layer 230 and the upper electrode 240 and may contact the first buffer layer 210 in the non-display area A2.

Next, the touch panel 300 is disposed on the piezoelectric element 200. The touch panel 300 may include transmitting electrodes 332, receiving electrodes 334 and bridges 312.

More particularly, the bridges 312 are formed in the display area A1 on the piezoelectric element 200, and a first insulating layer 320 is formed on the bridges 312 substantially all over the substrate 110. The bridges 312 may be formed of a conductive material such as metal. Alternatively, the bridges 312 may be formed of a transparent conductive material, but is not limited thereto.

The first insulating layer 320 may be formed of an inorganic insulating material such as silicon oxide ($SiO_2$) or silicon nitride (SiNx). The first insulating layer 320 has first and second touch contact holes 320a and 320b exposing both ends of each bridge 312 in the display area A1.

The transmitting electrodes 332 and the receiving electrodes 334 are formed in the display area A1 on the first insulating layer 320. The transmitting electrodes 332 and the receiving electrodes 334 may be formed of a transparent conductive material. Here, the transmitting electrode 332 contacts the bridge 312 through the first and second touch contact holes 320a and 320b. Accordingly, adjacent transmitting electrodes 332 are connected to each other through the bridge 312 in the first direction to form a transmitting line.

Meanwhile, although not shown in the figure, the receiving electrode 334 may be connected to another receiving electrode 334 adjacent thereto and may be formed as one body. The receiving electrodes 334 are connected to each other in the second direction to form a receiving line. However, the present disclosure is not limited thereto.

Alternatively, adjacent receiving electrodes 334 may be connected to each other through a bridge, and adjacent transmitting electrodes 332 may be formed as one body.

A second insulating layer 340 is formed on the transmitting electrodes 332 and the receiving electrodes 334 substantially all over the substrate 110. The second insulating layer 340 may be formed of an inorganic insulating material such as silicon oxide ($SiO_2$) or silicon nitride (SiNx).

Next, the polarizing plate 400 is disposed on the touch panel 300. The polarizing plate 400 may be a circular polarizing plate which includes a linear polarizer and a quarter wave plate and changes linearly polarized light into circularly polarized light and circularly polarized light into linearly polarized light. The polarizing plate 400 may improve the contrast ratio by blocking external light from being outputted after being reflected at the display panel 100.

The cover window 500 is disposed on the polarizing plate 400. The cover window 500 protects the display panel 100 from the external impacts. The cover window 500 may be formed of glass or plastic, but is not limited thereto.

As described above, in the display device according to the first embodiment of the present disclosure, by providing the piezoelectric element 200 between the display panel 100 and the touch panel 300, the mechanical energy by the touch is changed into the electrical energy and used.

Figure 6:
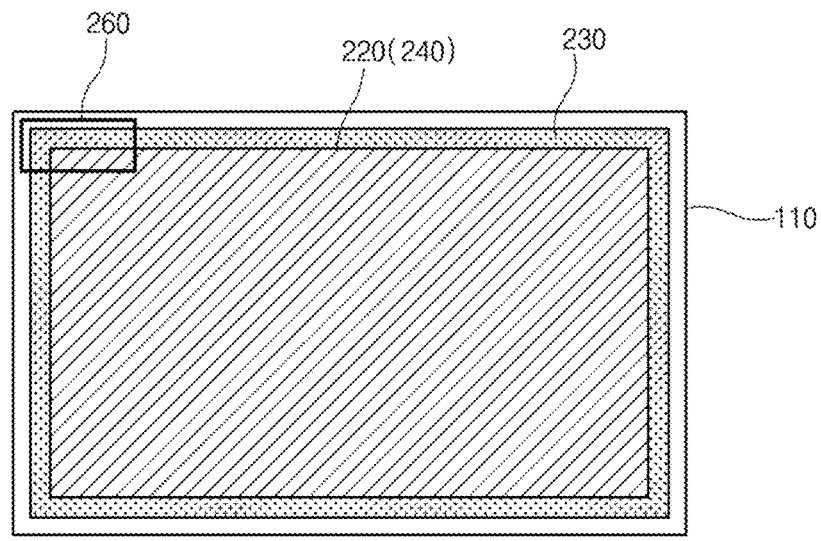
FIG. 6 and FIG. 7 are plan views schematically illustrating electrode structures of a piezoelectric element according to the first embodiment of the present disclosure.
Figure 7:
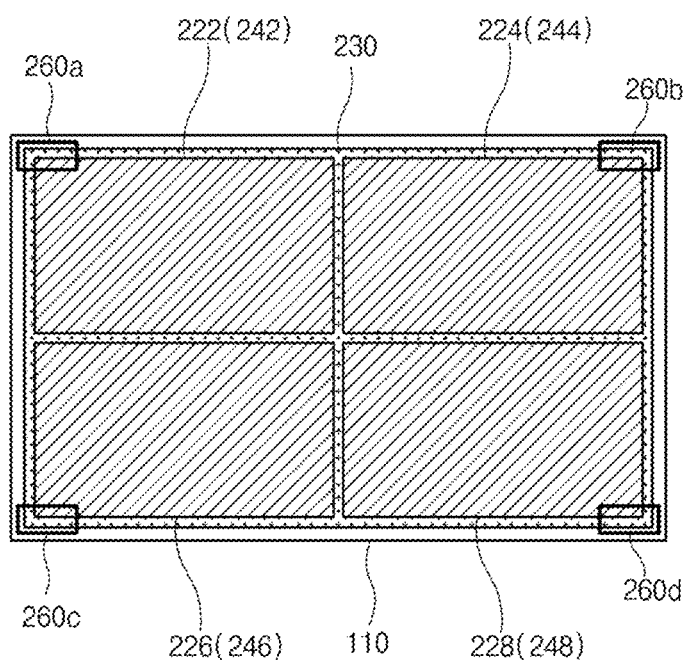

FIG. 6 and FIG. 7 are plan views schematically illustrating electrode structures of a piezoelectric element according to the first embodiment of the present disclosure.

In FIG. 6, each of the lower and upper electrodes 220 and 240 and the piezoelectric layer 230 of the piezoelectric element may be configured as one pattern with respect to an entire surface of the substrate 110, and one rectifying circuit 260 may be provided at one side of the substrate 110.

Alternatively, in FIG. 7, each of the lower and upper electrodes 220 and 240 of the piezoelectric element may be divided into first, second, third and fourth patterns 222, 224, 226, 228, 242, 244, 246 and 248, and the piezoelectric layer 230 may be configured as one pattern with respect to an entire surface of the substrate 110. In addition, first, second, third and fourth rectifying circuits 260a, 260b, 260c and 260d may be provided at four corners of the substrate 110 and may be connected to the first, second, third and fourth patterns 222, 224, 226, 228, 242, 244, 246 and 248, respectively. The configuration of FIG. 7 may reduce a distance between an area where a touch occurs and the rectifying circuit as compared with the configuration of FIG. 6, and the energy harvesting efficiency may be increased. It is to be noted that the number of the divided patterns of each of the lower and upper electrodes 220 and 240 may also be two, three, five or more, and the present disclosure is not limited thereto. In addition, there may be two, three, five or more rectifying circuits, which may be disposed at any other locations in addition to the corners, and the present disclosure is not limited thereto.

At this time, the piezoelectric layer 230 may be divided into four, but is not limited thereto.

Second Embodiment

Figure 8:
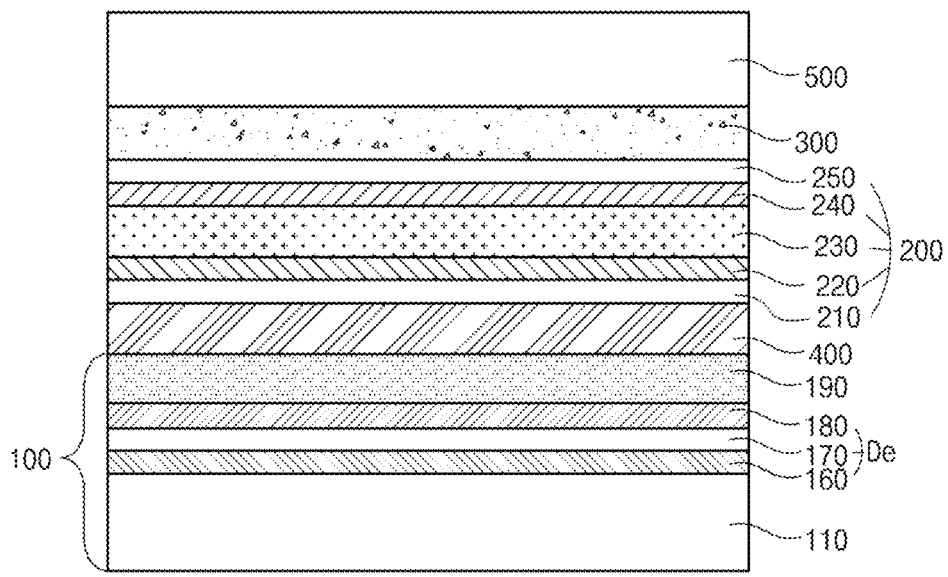
FIG. 8 is a cross-sectional view schematically illustrating a display device according to a second embodiment of the present disclosure.

FIG. 8 is a cross-sectional view schematically illustrating a display device according to a second embodiment of the present disclosure. The second embodiment has the same configuration as the first embodiment except for the position of the piezoelectric element. The same parts as the first embodiment will be designated by the same references, and explanation for the same parts will be shortened or omitted.

In FIG. 8, the display device according to the second embodiment of the present disclosure includes a display panel 100, a polarizing plate 400 on the display panel 100, a piezoelectric element 200 on the polarizing plate 400, a touch panel 300 on the piezoelectric element 200, and a cover window 500 on the touch panel 300.

The piezoelectric element 200 according to the second embodiment of the present disclosure may be formed directly on an upper surface of the polarizing plate 400 or may be formed directly on a lower surface of the touch panel 300. A piezoelectric layer 230 of the piezoelectric element 200, beneficially, may be formed of a transparent piezoelectric polymer.

For example, the piezoelectric polymer may be PVDF (polyvinylidene fluoride), P(VDF-TrFE) (polyvinylidene fluoride-co-trifluoroethylene), P(VDF-TrFE-CFE) (poly(vinylidene fluoride-co-triluoroethylene-chlorofluoroethylene), P(VDF-TrFE-CTFE) (poly(vinylidene fluoride-co-triluoroethylene-chlorotrifluoroethylene), PVDF doped with carbon nanotubes, or a phosphazene-based polymer, but is not limited thereto. Here, poly bis(trifluoroethoxy) phosphazene may be used as the phosphazene-based polymer.

While the polarizing plate 400 is disposed between the touch panel 300 and the cover window 500 in the first embodiment of the present disclosure, the polarizing plate 400 is disposed between the display panel 100 and the piezoelectric element 200 in the second embodiment.

In the display device according to the second embodiment, since the piezoelectric element 200 is disposed closer to the cover window 500 than the first embodiment, deformation due to a touch may further occur, thereby increasing the energy harvesting efficiency.

Third Embodiment

Figure 9:
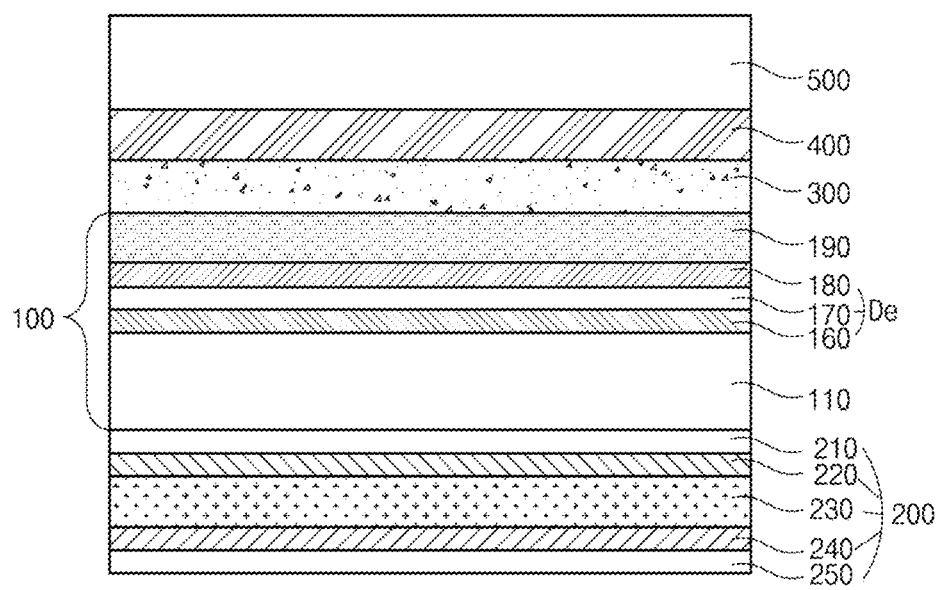
FIG. 9 is a cross-sectional view schematically illustrating a display device according to a third embodiment of the present disclosure.

FIG. 9 is a cross-sectional view schematically illustrating a display device according to a third embodiment of the present disclosure. The third embodiment has the same configuration as the first embodiment except for the position of the piezoelectric element. The same parts as the first embodiment will be designated by the same references, and explanation for the same parts will be shortened or omitted.

In FIG. 9, the display device according to the third embodiment of the present disclosure includes a display panel 100, a touch panel 300 on the display panel 100, a polarizing plate 400 on the touch panel 300, and a cover window 500 on the polarizing plate 400. In addition, the display device further includes a piezoelectric element 200 under the display panel 100.

The piezoelectric element 200 according to the third embodiment of the present disclosure may be formed directly on a lower surface of the substrate 110 of the display panel 100. Since the piezoelectric element 200 is disposed under the display panel 100 where an image is not displayed, a piezoelectric layer 230 of the piezoelectric element 200 may be formed of an opaque piezoelectric ceramic or an opaque organic-inorganic complex in addition to a transparent piezoelectric polymer.

For example, the piezoelectric polymer may be PVDF (polyvinylidene fluoride), P(VDF-TrFE) (polyvinylidene fluoride-co-trifluoroethylene), P(VDF-TrFE-CFE) (poly(vinylidene fluoride-co-triluoroethylene-chlorofluoroethylene), P(VDF-TrFE-CTFE) (poly(vinylidene fluoride-co-trifluoroethylene-chlorotrifluoroethylene), PVDF doped with carbon nanotubes, or a phosphazene-based polymer, but is not limited thereto. Here, poly bis(trifluoroethoxy) phosphazene may be used as the phosphazene-based polymer.

In addition, the piezoelectric ceramic may be PbZrTiO3 (PZT, Lead Zirconium Titanate), Pb(MgNb)—PbZrTiO3, PNN-PT (Pb(NiNb)—PbTiO3), or PLZT (PbLaZrTiO3). Alternatively, the piezoelectric ceramic may be BaTiO3 (BTO, barium Titanate) or KNaNbO3 (KNN, kalium natrium niobate).

Meanwhile, the organic-inorganic complex may include the above-mentioned piezoelectric ceramic and a polymer. Here, the polymer may be one of the piezoelectric polymers described above or may be a non-piezoelectric polymer such as epoxy, polyimide or polyurethane.

In the display device according to the third embodiment, since the piezoelectric element 200 is disposed under the display panel 100, the brightness of the display device may be maximized, and there is an advantage that the piezoelectric material may be widely chosen as compared with the first and second embodiments.

Fourth Embodiment

Figure 10:
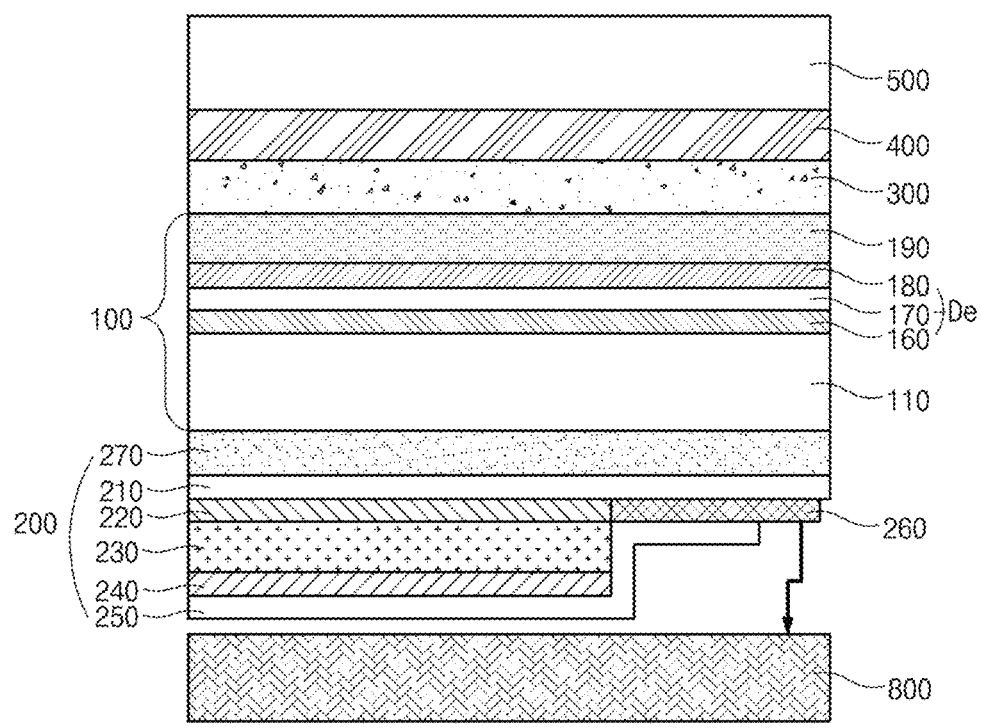
FIG. 10 is a cross-sectional view schematically illustrating a display device according to a fourth embodiment of the present disclosure.

FIG. 10 is a cross-sectional view schematically illustrating a display device according to a fourth embodiment of the present disclosure. The fourth embodiment has the same configuration as the first embodiment except for the position of the piezoelectric element. The same parts as the first embodiment will be designated by the same references, and explanation for the same parts will be shortened or omitted.

In FIG. 10, the display device according to the fourth embodiment of the present disclosure includes a display panel 100, a touch panel 300 on the display panel 100, a polarizing plate 400 on the touch panel 300, and a cover window 500 on the polarizing plate 400. In addition, the display device further includes a piezoelectric element 200 under the display panel 100.

The piezoelectric element 200 according to the fourth embodiment of the present disclosure includes a base film 270, a first buffer layer 210, a lower electrode 220, a piezoelectric layer 230, an upper electrode 240, and a second buffer layer 250. The first buffer layer 210, the lower electrode 220, the piezoelectric layer 230, the upper electrode 240, and the second buffer layer 250 are sequentially disposed on a first surface of the base film 270. In addition, a rectifying circuit 260 is formed on the first surface of the base film 270. Here, the rectifying circuit 260 may be disposed on the first buffer layer 210, and the second buffer layer 250 may cover a part of the rectifying circuit 260.

The piezoelectric element 200 may be attached to the display panel 100 such that a second surface of the base film 270 may contact a lower surface of the substrate 110 of the display panel 100. At this time, the base film 270 may be attached to the lower surface of the substrate 110 by an adhesive.

Meanwhile, a battery 800 may be disposed under the piezoelectric element 200.

Since the piezoelectric element 200 is disposed under the display panel 100 where an image is not displayed, a piezoelectric layer 230 of the piezoelectric element 200 may be formed of an opaque piezoelectric ceramic or an opaque organic-inorganic complex in addition to a transparent piezoelectric polymer.

For example, the piezoelectric polymer may be PVDF (polyvinylidene fluoride), P(VDF-TrFE) (polyvinylidene fluoride-co-trifluoroethylene), P(VDF-TrFE-CFE) (poly(vinylidene fluoride-co-triluoroethylene-chlorofluoroethylene), P(VDF-TrFE-CTFE) (poly(vinylidene fluoride-co-trifluoroethylene-chlorotrifluoroethylene), PVDF doped with carbon nanotubes, or a phosphazene-based polymer, but is not limited thereto. Here, poly bis(trifluoroethoxy) phosphazene may be used as the phosphazene-based polymer.

In addition, the piezoelectric ceramic may be PbZrTiO3 (PZT, Lead Zirconium Titanate), Pb(MgNb)—PbZrTiO3, PNN-PT (Pb(NiNb)—PbTiO3), or PLZT (PbLaZrTiO3). Alternatively, the piezoelectric ceramic may be BaTiO3 (BTO, barium Titanate) or KNaNbO3 (KNN, kalium natrium niobate).

Meanwhile, the organic-inorganic complex may include the above-mentioned piezoelectric ceramic and a polymer. Here, the polymer may be one of the piezoelectric polymers described above or may be a non-piezoelectric polymer such as epoxy, polyimide or polyurethane.

The display device according to the fourth embodiment may be variously applied by implementing the piezoelectric element 200 as a film type. Since the rectifying circuit 260 is provided on the base film 270 of the piezoelectric element 200, it is easy to connect the rectifying circuit 260 and the battery 800.

In the present disclosure, by providing the piezoelectric element under the touch panel, the mechanical energy is changed into the electrical energy and is used. Accordingly, the power efficiency of the display device may be improved.

At this time, the piezoelectric element is close to the cover window, and thus deformation due to the touch may further occur, thereby increasing the efficiency.

In addition, the piezoelectric element is disposed under the display panel where an image is not displayed, the brightness of the display device may be maximized, and the piezoelectric material may be widely chosen.

Meanwhile, by implementing the piezoelectric element as a film type, the display device may be variously applied. By providing the rectifying circuit on the base film of the piezoelectric element, connecting the rectifying circuit and the battery may be facilitated and the efficiency may be increased.

It will be apparent to those skilled in the art that various modifications and variations may be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:
1. A display device, comprising:
a touch panel;
a display panel under the touch panel and configured to display an image, the display panel including a display area configured to display an image and a non-display area surrounding the display area;
a piezoelectric element under the touch panel and including an upper electrode, a lower electrode and a piezoelectric layer; and
a rectifying circuit connected to the piezoelectric element,
wherein each of the lower electrode and the upper electrode is configured as one or more patterns with respect to an entire surface of the display panel, and
wherein each of the lower electrode and the upper electrode has a larger area than a total area of electrodes of the touch panel overlapping the display area.

2. The display device of claim 1, wherein the piezoelectric element is disposed between the touch panel and the display panel.

3. The display device of claim 2, wherein the piezoelectric layer includes a piezoelectric polymer.

4. The display device of claim 3, wherein the piezoelectric polymer includes polyvinylidene fluoride (PVDF), polyvinylidene fluoride-co-trifluoroethylene (P(VDF-TrFE)), poly(vinylidene fluoride-co-triluoroethylene-chlorofluoroethylene) (P(VDF-TrFE-CFE)), poly(vinylidene fluoride-co-triluoroethylene-chlorotrifluoroethylene) (P(VDF-TrFE-CTFE)), PVDF doped with carbon nanotubes, or a phosphazene-based polymer.

5. The display device of claim 1, further comprising a polarizing plate on the touch panel or between the piezoelectric element and the display panel.

6. The display device of claim 1, wherein the piezoelectric element further includes a first buffer layer under the lower electrode and a second buffer layer on the upper electrode.

7. The display device of claim 6, wherein the second buffer layer has a larger area than each of the lower electrode and the upper electrode.

8. The display device of claim 1, wherein a number of the rectifying circuit corresponds to the number of the patterns of each of the lower electrode and the upper electrode.

9. The display device of claim 1, wherein the piezoelectric layer is interposed between the lower electrode and the upper electrode, and one of the lower electrode and the upper electrode is disposed between the piezoelectric layer and the touch panel.

10. The display device of claim 1, wherein each of the lower electrode and the upper electrode is partially disposed in the non-display area.

11. A display device, comprising:
a touch panel;
a display panel under the touch panel and displaying an image;
a piezoelectric element under the touch panel and including an upper electrode, a lower electrode and a piezoelectric layer; and
a rectifying circuit connected to the piezoelectric element,
wherein the display panel includes a substrate, where a display area and a non-display area are defined, and a thin film transistor and a light-emitting diode formed in the display area on the substrate, and
wherein the rectifying circuit is formed in the non-display area on the substrate.

12. The display device of claim 11, wherein each of the upper electrode and the lower electrode has a protrusion in the non-display area, and the protrusion of the lower electrode and the protrusion of the upper electrode are spaced apart from each other and are electrically connected to the rectifying circuit formed in the non-display area.

13. The display device of claim 11, wherein the rectifying circuit includes a diode having an anode, a cathode, a P-type semiconductor and an N-type semiconductor, the anode and the cathode are formed of a same material in a same layer as a gate electrode or source and drain electrodes of the thin film transistor, and one of the P-type semiconductor and the N-type semiconductor is formed of a same material in a same layer as a semiconductor layer of the thin film transistor.

14. A display device, comprising:
a touch panel;
a display panel under the touch panel and configured to display an image, the display panel including a display area configured to display an image and a non-display area surrounding the display area;
a piezoelectric element under the touch panel and including an upper electrode, a lower electrode and a piezoelectric layer; and
a rectifying circuit connected to the piezoelectric element,
wherein the display panel is disposed between the touch panel and the piezoelectric element, and
wherein each of the lower electrode and the upper electrode has a larger area than a total area of electrodes of the touch panel overlapping the display area.

15. The display device of claim 14, wherein the piezoelectric element further includes a base film between the display panel and the lower electrode, and the rectifying circuit is formed on the base film.

16. The display device of claim 14, wherein the piezoelectric layer includes a piezoelectric polymer, a piezoelectric ceramic or an organic-inorganic complex including a piezoelectric ceramic and a polymer.

17. The display device of claim 14, wherein each of the lower electrode and the upper electrode is partially disposed in the non-display area.

* * * * *